US011487508B2

(12) United States Patent
Topaloglu et al.

(10) Patent No.: US 11,487,508 B2
(45) Date of Patent: Nov. 1, 2022

(54) MAGNETIC TUNNEL JUNCTION BASED TRUE RANDOM NUMBER GENERATOR (71) Applicant: International Business Machines Corporation, Armonk, NY (US)

(72) Inventors: Rasit O. Topaloglu, Poughkeepsie, NY (US); Jonathan Z. Sun, Shrub Oak, NY (US); Matthias G. Gottwald, New Rochelle, NY (US); Chandrasekharan Kothandaraman, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 224 days.

(21) Appl. No.: 16/383,879

(22) Filed: Apr. 15, 2019

(65) Prior Publication Data

US 2020/0326911 A1 Oct. 15, 2020

(51) Int. Cl.
*G06F 7/58* (2006.01)
*H01L 43/12* (2006.01)
(Continued)

(52) U.S. Cl.
CPC .............. *G06F 7/588* (2013.01); *H01L 43/02* (2013.01); *H01L 43/08* (2013.01); *H01L 43/10* (2013.01); *H01L 43/12* (2013.01); *G06F 7/58* (2013.01)

(58) Field of Classification Search
None
See application file for complete search history.

(56) References Cited

U.S. PATENT DOCUMENTS 6,563,311 B2 * 5/2003 Zagoskin ............... G06N 10/00
505/190
6,774,734 B2 8/2004 Christensen et al.
(Continued)

FOREIGN PATENT DOCUMENTS

JP 2010015259 A 1/2010
WO 2016198886 A1 12/2016

OTHER PUBLICATIONS

Sengupta, A., "A vision for All-Spin Neural Networks: A device to System Perspective", IEEE Transactions on Circuits and Systems—I:Regular Papers, Dec. 2016, pp. 2267-2277, vol. 63, No. 12.
(Continued)

*Primary Examiner* — Jefferson A Evans
(74) *Attorney, Agent, or Firm* — Scully, Scott, Murphy & Presser, PC; Daniel P. Morris. Esq.

(57) ABSTRACT

A true random number generator (TRNG) device having a magnetic tunnel junction (MTJ) structure coupled to a domain wall wire. The MTJ structure is formed of a free layer (FL) and a reference layer (RL) that sandwiches a tunnel barrier layer. The free layer has anisotropy energy sufficiently low to provide stochastic fluctuation in the orientation of the magnetic state of the free layer via thermal energy. The domain wall wire is coupled to the MTJ structure. The domain wall wire has a domain wall. Movement of the domain wall tunes a probability distribution of the fluctuation in the orientation of the magnetic state of the free layer. The domain wall can be moved by application of a suitable current through the wire to tune the probability distribution of 1's and 0's generated by a readout circuit of the TRNG device.

20 Claims, 4 Drawing Sheets (51) Int. Cl.
*H01L 43/10* (2006.01)
*H01L 43/02* (2006.01)
*H01L 43/08* (2006.01)

(56) References Cited

U.S. PATENT DOCUMENTS

| | | | |
|---|---|---|---|
| 8,300,445 B2 | 10/2012 | Lee et al. | |
| 8,331,140 B2 | 12/2012 | Ohno et al. | |
| 8,537,506 B2 | 9/2013 | Bae et al. | |
| 9,824,735 B1* | 11/2017 | Kan | G06F 7/588 |
| 10,078,496 B2 | 9/2018 | Gupta et al. | |
| 10,340,901 B2* | 7/2019 | Yoshinari | H01L 43/08 |
| 10,347,824 B2* | 7/2019 | Choi | H01L 27/222 |
| 10,719,298 B1* | 7/2020 | Braganca | H01F 10/329 |
| 10,777,247 B1* | 9/2020 | Sun | H01L 43/02 |
| 2012/0286382 A1* | 11/2012 | Jan | G11C 11/161 |
| | | | 257/421 |
| 2013/0300406 A1* | 11/2013 | Pepka | G01R 33/0035 |
| | | | 324/244 |
| 2014/0021571 A1* | 1/2014 | Lei | H01L 43/08 |
| | | | 257/427 |
| 2014/0067890 A1 | 3/2014 | Zhu et al. | |
| 2014/0108478 A1 | 4/2014 | Lee et al. | |
| 2015/0044778 A1* | 2/2015 | Wang | G01N 33/54326 |
| | | | 436/501 |
| 2015/0199177 A1* | 7/2015 | Braganca | G11B 5/746 |
| | | | 365/158 |
| 2017/0212728 A1 | 7/2017 | Sethi et al. | |
| 2017/0330070 A1* | 11/2017 | Sengupta | H01L 43/08 |
| 2018/0254773 A1* | 9/2018 | Yoshinari | H01F 10/3286 |
| 2018/0374502 A1* | 12/2018 | Nagasawa | G11B 5/3909 |
| 2021/0117159 A1* | 4/2021 | Hanyu | G06F 7/588 |
| 2021/0240445 A1* | 8/2021 | Dixit | G11C 11/1673 |
| 2022/0044719 A1* | 2/2022 | Li | G06N 3/0472 |
| 2022/0165933 A1* | 5/2022 | Lee | G06F 7/588 |

OTHER PUBLICATIONS

W. Choi, et al. "A Magnetic Tunnel Junction Based True Random Number Generator with Conditional Perturb and Real-Time, Output Probability Tracking", IEDM, Dec. 2014, pp. 5.

Yang et al., A Robust -40 to 120 degrees C All-Digital True Transom Number Generator in 40 nm CMOAS, Sep. 2015, Simposium on VLSI Circuits (VLSI Circuits), pp. 103.

Zhang et al., "The magneto-Hall difference and the planar extraordinary Hall balance", AIP Advances 6, 045019, Apr. 27, 2016, pp. 1-10, https://doi.org/10.1063/1.4948443.

* cited by examiner

MAGNETIC TUNNEL JUNCTION BASED TRUE RANDOM NUMBER GENERATOR

BACKGROUND OF THE INVENTION

This disclosure is directed to random number generators and more particularly to magnetic tunnel junction based true random number generator (TRNG) circuits, computer-implemented methods and systems.

Encryption keys are typically random "0" and "1" number series generated by a random number generator (RNG). The randomness of the "0" and "1" numbers should be unpredictable and un-cloneable, including to those who know how the random number generator is designed. Most devices that generate such random numbers, however, are expensive, require high power, generate data slowly, and can easily be hacked.

A TRNG can be formed by employing a magnetic tunnel junction (MTJ) device. The MTJ device may include three layers, that is, a reference layer, a barrier layer, and a free layer. The free layer has two states. Energy separating the two stable states of the free layer include a thermal activation energy difference such that the states oscillate to generate random outputs. Barrier height originates from magnetic anisotropy—anisotropy giving preferred direction for energy minima for the magnetic moment. Thermal energy causes the moment to fluctuate against the barrier, occasionally overcoming it, resulting in switching of magnetic state, or continuously generating positional noise during such fluctuation. Either the switching of the state, or the positional noise, or both, can be converted into electrical signals by measuring the resistance of the magnetic tunnel junction, as its resistance depends on the relative orientation of the two electrode's magnetic moments. A voltage bias or bias magnetic field (such as dipolar magnetic field from adjacent materials with magnetic moment) can be used to modify the statistical nature of the moment's fluctuation, thus changing the mean value and life-time of the fluctuations, for example.

For many applications, it is desirable to make a true random number generator with equal probability of "1" and "0." There is a need to make the true random number generator that requires very little power consumption and operates at low voltages and can be formed with CMOS integrated circuit-compatible fabrications processes.

SUMMARY OF THE INVENTION

In one embodiment, a true random number generator (TRNG) device having a magnetic tunnel junction (MTJ) structure coupled to a domain wall wire is disclosed. The MTJ structure is formed of a free layer (FL) and a reference layer (RL) that sandwiches a tunnel barrier layer. The free layer has anisotropy energy sufficiently low to provide stochastic fluctuation in the orientation of the magnetic state of the free layer via thermal energy. The domain wall wire is coupled to the MTJ structure. The domain wall wire has a domain wall. The static position of the domain wall controls the probability distribution of the magnetic fluctuation of the free layer in the MTJ. The domain wall can be moved by application of a suitable current through the domain wall wire, thus changing the probability distribution, accomplishing a tuning function to the probability of 1's and 0's generated by a readout circuit the TRNG device.

In one embodiment, a method of forming a true random number generator (TRNG) apparatus includes forming a magnetic tunnel junction (MTJ) structure by forming a magnetic reference layer, forming a magnetic free layer and forming a tunnel barrier layer sandwiched between the reference layer and the free layer. The free layer has anisotropy energy sufficiently low to provide stochastic fluctuation in the orientation of the magnetic state of the free layer via thermal energy. The method includes forming a domain wall wire coupled to the MTJ structure, the domain wall wire having a domain wall. Movement of the domain wall tunes a probability distribution of the fluctuation in the orientation of the magnetic state of the free layer. The method may further include tuning the TRNG by applying a current to the domain wall wire and switching a direction of the current flowing through the domain wall wire to move the domain wall in a direction determined by the direction of the current.

Further features as well as the structure and operation of various embodiments are described in detail below with reference to the accompanying drawings. In the drawings, like reference numbers indicate identical or functionally similar elements.

DETAILED DESCRIPTION OF PREFERRED EMBODIMENTS

In one embodiment, a true random number generator (TRNG) device having a magnetic tunnel junction (MTJ) structure coupled to a domain wall wire is disclosed. The MTJ structure is formed of a magnetic free layer and a pinned magnetic reference layer that sandwiches a tunnel barrier layer. The free layer is constructed to have its anisotropy energy sufficiently low to provide stochastically distributed states via thermal fluctuation. The domain wall wire is magnetic dipole layer having a domain wall (DW) separating magnetic domains that are magnetized in opposite directions. The fringe dipolar magnetic field from the domains provide a tilting bias for the free-layer magnetic moment's anisotropy potential, causing it to statistically prefer the direction of the dipolar field against the opposite direction. Depending on the relative location of the DW, the strength of this dipolar field varies, thus the amount of bias the free-layer is given also varies, causing the statistical average value of the free-layer's magnetic direction, or its resulting stochastic digital representation's mean value, to vary. The domain wall wire has sufficient coupling to the free layer such that the dipole field affects the tilt of the anisotropy energy of the free layer so as to favor either 0 or 1 state. The domain wall can be moved by application of a suitable current through the domain wall wire to tune the probability distribution of 1's and 0's generated by the TRNG device.

In one embodiment, a method of forming a true random number generator (TRNG) apparatus forming a magnetic tunnel junction (MTJ) structure includes forming a magnetic reference layer, forming a magnetic free layer, wherein the magnetic free-layer and reference layer are joined by a spin-preserving transport tunnel barrier (such as MgO), which allows an electronic transport detection of the relative magnetic orientation of the two electrodes. The magnetic layers (both free- and reference) have anisotropy energies that dictate preferred direction of their magnetic moments. The reference layer's energy barrier is significantly higher than that of kB T, making its moment remain substantially stationary for the current applications, while the free-layer's anisotropy energy barrier is comparable to the thermal energy at operating temperature, making the free-layer's moment orientation significantly disturbed by thermal fluctuation, and hence providing the stochastic behavior. The free-layer's magnetic orientation can reverse between the two energy minimums stochastically, when the energy barrier is sufficiently low compared to these stimuli. The relative orientation of the magnetic moment between the free- and reference-layers determines the MTJ's resistance. Usually a parallel alignment of the moment corresponds to the minimum resistance, while an antiparallel alignment corresponds to the maximum. A random flip of the orientation of magnetization of the magnetic free layer therefore will cause a random change of the resistance of the MTJ which can be converted to a digital random output. More generally the moment can also have sufficiently large (but non-reversing) fluctuation amplitudes that cover an analog continuum between the 0- and 1-state resistance that contributes to analog noise output.

By placing a domain-wall (DW) containing magnetic structure adjacent to the MTJ, the position of the DW, or more generally the specific magnetic texture of the structure, provides a bias magnetic field on the MTJ, which can be used to control the nature of the stochastic fluctuation of the free-layer (such as the mean position and/or life-time of the states of the free-layer).

Figure 1:
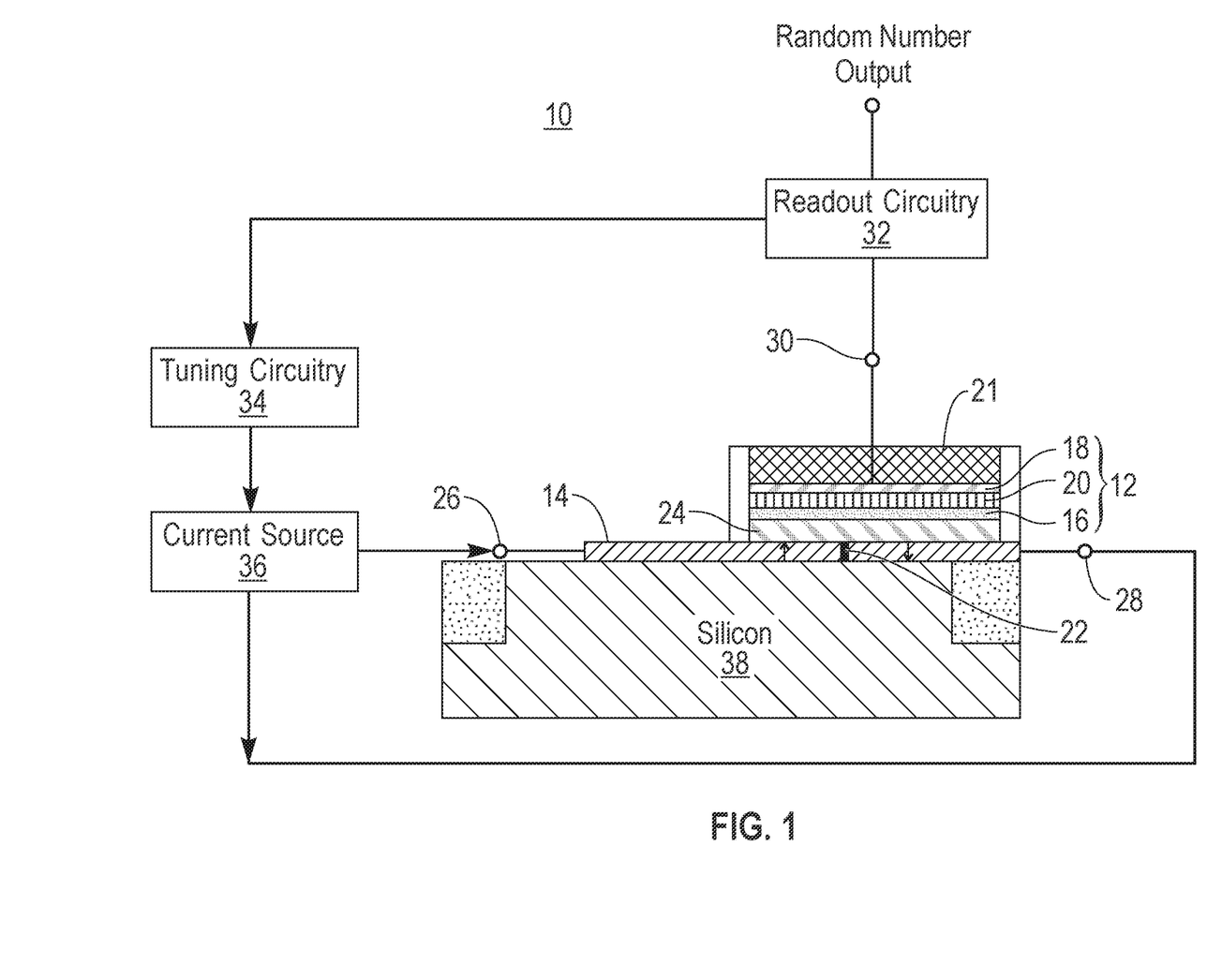
FIG. 1 depicts one embodiment of a TRNG disclosed in this specification.

FIG. 1 shows one embodiment of a TRNG device 10 of the present invention. The TRNG device 10 includes an MTJ structure 12 coupled to a domain wall wire device 14. The MTJ structure 12 is formed of a magnetic free layer (FL) 16 and a magnetic reference layer (RL) 18 that sandwiches a tunnel barrier layer 20. The domain wall wire device 14 has a domain wall 22 and terminals 26 and 28. The arrows in these different structures represent the orientation of the magnetic moment of the domain-wall stripe that is ferromagnetic. In one embodiment, the TRNG device 10 may include a magnetic separation layer (MSL) 24 between the magnetic free layer 16 and the domain wall wire 14. Terminals 26 and 28 can be left floating or tied to ground. Below domain wall wire 14 may be silicon 38.

The magnetization orientations of the magnetic free layer 16 and magnetic reference layer 18 can be either parallel or anti-parallel relative to each other. The state of the free layer 16 can be flipped by an external field, by an electrical current passing through it, or by thermal energy.

In one embodiment, the thermal noise in the MTJ's free-layer environment is sufficient to flip the magnetization orientation in the magnetic free-layer 16 in a random fashion. The tunnel barrier provides the tunnel conduction mechanism for resistive read out of the relative orientations of the free-layer in the MTJ with respect to the reference layer. The energy barrier is the barrier thermal fluctuation needs to overcome to flip the FL 16 from one magnetic orientation to the other. The flipping of the magnetic orientation of FL 16 creates the random number. In order to generate a random number series, the magnetization orientation of free layer 16 is randomly switched and the resistance across MTJ structure 12 is periodically sampled in order to generate a series of bits. The output from terminal 30 flips correspondingly and is converted by readout circuitry 32 to a digital random number.

In one embodiment, the location of domain wall 22 can be adjusted to tune the TRNG device 10 to achieve the desired probability distribution. For example in extreme left and right positions of the domain wall, no or little flipping may occur and the free-layer would be stuck in its 0 or 1 state respectively. Thus when sampled in time, all or mostly one kind of 0 or 1 bit would be present. When the domain wall moves to the middle-position, its dipolar field changes to an intermediate value, and the free-layer would thermally fluctuate more between its 0 and 1 state. Changing the DW position would cause a change of the said fluctuation's statistical distribution, and thus changing the mean-value of the read-out data sequence.

The domain wall 22 fringe dipole magnetic field acting on the free layer 16 of the MTJ 12 causes free layer 16 to prefer the direction of the dipole magnetic field. The anisotropy potential of the free layer 16 is being tilted by the external field supplied by the fringe field of domain wall 22.

Figure 2:
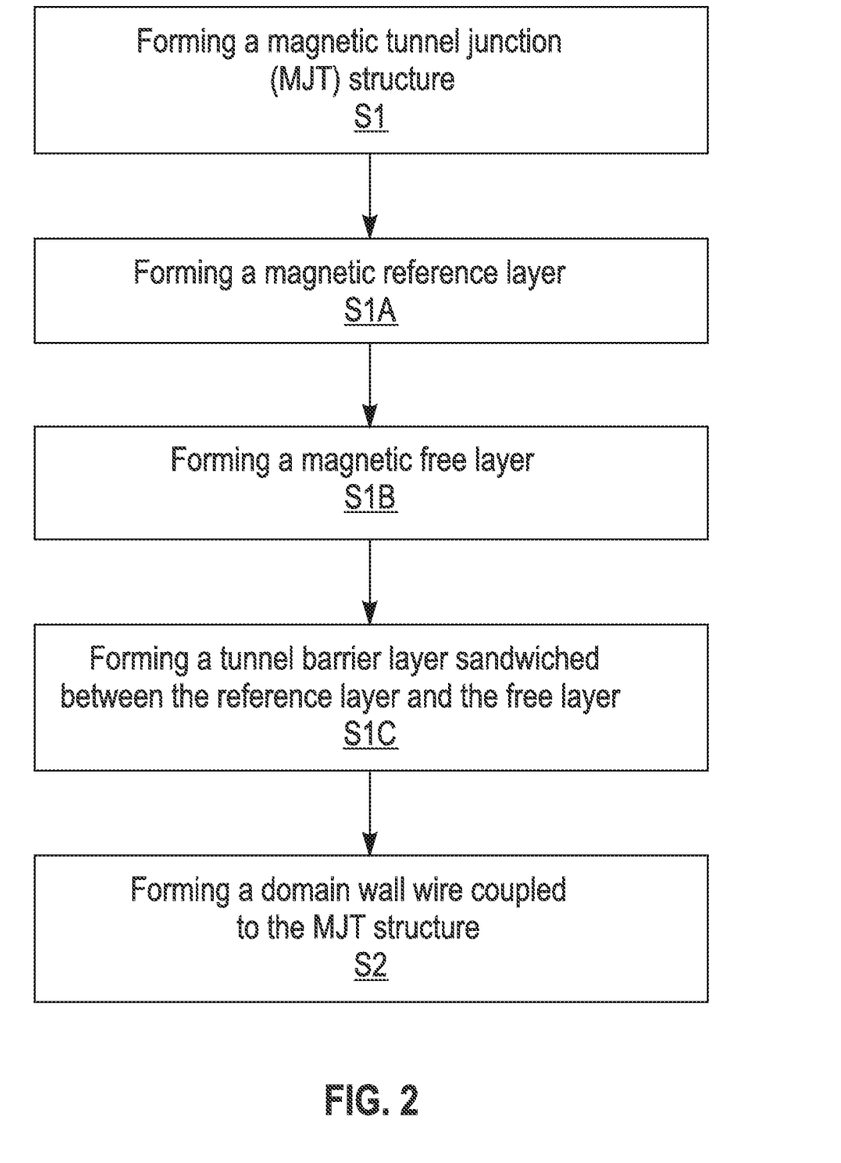
FIG. 2 is a flow diagram of one embodiment of the method of forming the TRNG disclosed in this specification.

FIG. 2 depicts one embodiment of a method of forming a true random number generator (TRNG) apparatus. The method includes step S1 of forming a magnetic tunnel junction (MTJ) structure. Step S1 includes step S1A of forming a magnetic reference layer, step S1B of forming a magnetic free layer and step S1C of forming a tunnel barrier layer sandwiched between the reference layer and the free layer. The free layer of the MTJ structure has anisotropy energy sufficiently low to provide stochastic fluctuation in the orientation of the magnetic state of the free layer via thermal energy. Step S2 includes forming a domain wall wire coupled to the MTJ structure. The domain wall wire has a domain wall, wherein movement of the domain wall tunes a probability distribution of the fluctuation in the orientation of the magnetic state of the free layer.

Returning to FIG. 1, in one aspect, tuning circuitry 34 controls the current applied from a current source 36 to the terminals 26 and 28 of domain wall wire 14. The tuning circuitry 30 controls the current that is applied to domain wall wire 14 to tune the 1's and 0's sequences by the movement of the domain wall 22. The tuning circuit 34 controls the position of the domain wall 22 and the movement left or right of domain wall 22 within the domain wall wire 14. Movement of the domain wall 22 can be controlled by changing the direction of the current applied to terminals 26 and 28. For example, sending current from terminal 26 to 28 would move the domain wall towards left and sending current from terminal 28 to 26 would move the domain wall towards right. The domain wall can also be moved by external magnetic field, or by a spin-orbit torque layer adjacent to the domain wall wire layer.

The domain wall 22 can be set when the TRNG device 10 is calibrated. Calibration in this context refers to moving the domain wall location by applying current and pinning at a point where we get a desired ratio of 0 and 1's. The DW position can be pinned—i.e. without intentional drive (bias current or field, for example) the DW will remain in-place. Thus once calibrated it maintains its position for the MTJ to fluctuate with desired statistical properties. In one embodiment, once domain wall 22 is fixed, no current may be needed because once the TRNG device 10 is calibrated the domain wall 22 should not move anymore since this would change the probability distributions of the 1's and 0's.

In one embodiment, the TRNG device 10 can be tuned to achieve a desired probability distribution of 1's and 0's. For example, an equal probability distribution of 1's and 0's may be desirable in certain security applications. In one embodiment, the TRNG device 10 can be tuned by the domain wall wire 14 to generate random numbers with equal probability of 1's and 0's. In one embodiment, the TRNG device 10 is tunable using a biasing methodology that can tune the device for 0.5 probability of 1's and 0's. In one aspect, the TRNG device 10 can be tuned to eliminate process variations.

The state variable of the MTJ structure 12 is the free-layer's magnetic moment direction, which should be fluctuating between the 0-state θ=0, and the 1-state θ=π, with θ being its relative angle to the moment direction of the fixed layer. The fluctuation should follow Poisson statistics over a time-scale long compared to its intrinsic dynamic time-constant, of the order $\tau_0 \sim 1/\alpha\gamma Hk$ with $\gamma=2\mu_B/h$, and Hk the element's anisotropy field, where $\gamma=2\mu_B/h$ is the gyromagnetic ratio, α the magnetic damping coefficient. and Ha/Hk describes the effect of an on-axis applied field Ha has in shifting the two extrema points relative height. Hk here is the uniaxial anisotropy field, together with the magnetic moment m it defines the energy barrier height of Eb0=mHk/2 and ξ=Eb0/kBT. The Hk of the free-layer can be adjusted within a materials determined range of around 1 to 10 kOe, giving a range of $\tau_0$~ns or longer, which governs the approximate time-scale of telegraphing steps. This indicates the equilibrium probability of finding the bit in 0 or 1 state is exponentially controlled by the applied magnetic field Ha. The intrinsic barrier height ξ (actually the intrinsic magnetic moment m) controls the sensitivity of the probability's dependence on applied field Ha.

Other structures involving engineering of the anisotropy energy land-scape or using shape or anti-ferromagnetic materials as the free-layer that would allow this time scale to be reduced well below 1 ns may also be used.

In one embodiment, the tuning circuit 34 verifies the uniformity of 1's and 0's. The tuning circuit 34 provides a feed-back system that tunes the TRNG device 10 by applying a current pulse to the domain wall wire to adjust the domain wall to an optimal position for uniformity of the 1's and 0's in the generated random numbers.

Figure 3:
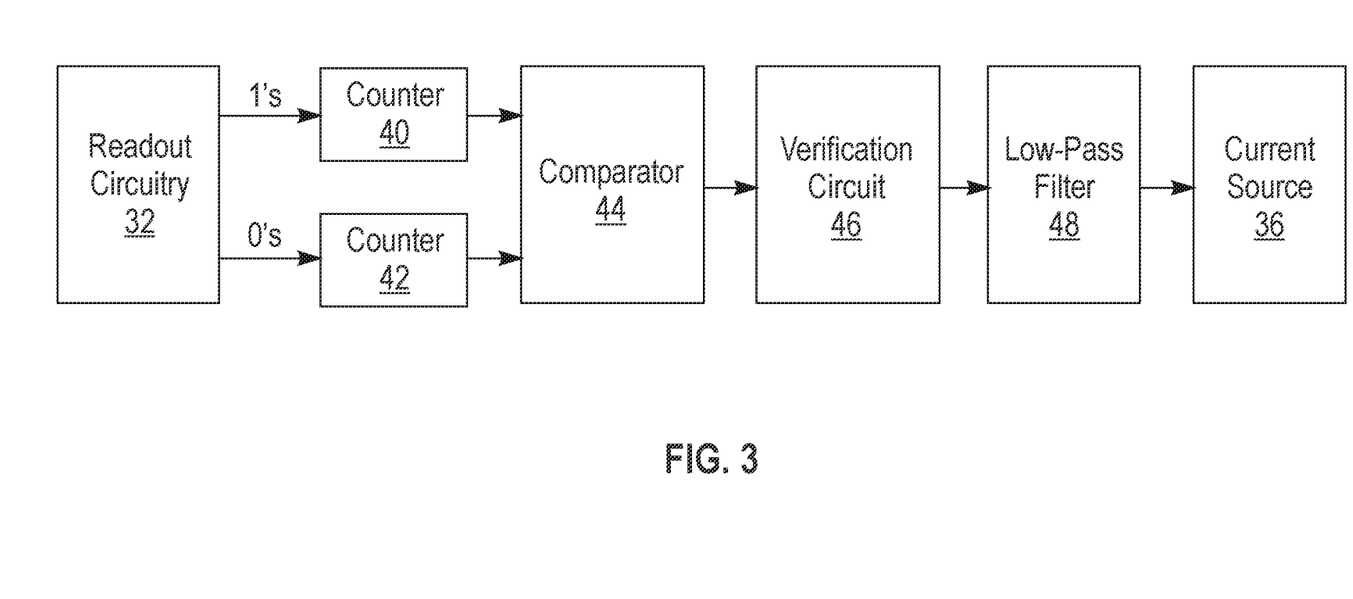
FIG. 3 is a block diagram of one embodiment of a tuning circuit of the TRNG disclosed in this specification.

In one embodiment, as shown in FIG. 3, the tuning circuit 34 includes a counter 40 for counting 1's and a counter 42 for counting 0's. A comparator 44 compares the outputs of these two counters. The output of comparator 44 can be optionally coupled to a low-pass filter 48 to drive the current source 36 to change direction of current depending on comparator output. Tuning can be conducted for a set time, or an additional circuit could monitor that the biasing circuit has started to cause the MTJ structure 12 to flip back and forth to decide on finalizing tuning. In some embodiments, two counters and a comparator could be replaced by a single counter that only measures either 1's or 0's, and a comparator that takes a reference value. Tuning can be repeated at manufacture, at power-up, or at specific maintenance intervals.

In one embodiment, the tuning circuit 34 includes a verification circuit 46 for determining whether a uniformity of the distribution of the random output is below a threshold. The verification circuit 46 controls the current source 36 for applying a current in response to the uniformity of the distribution of the random output being below a threshold. The current is applied to adjust the position of the domain wall such that that uniformity of the distribution of the random output is at or above the threshold as determined by the verification circuit.

Figure 4:
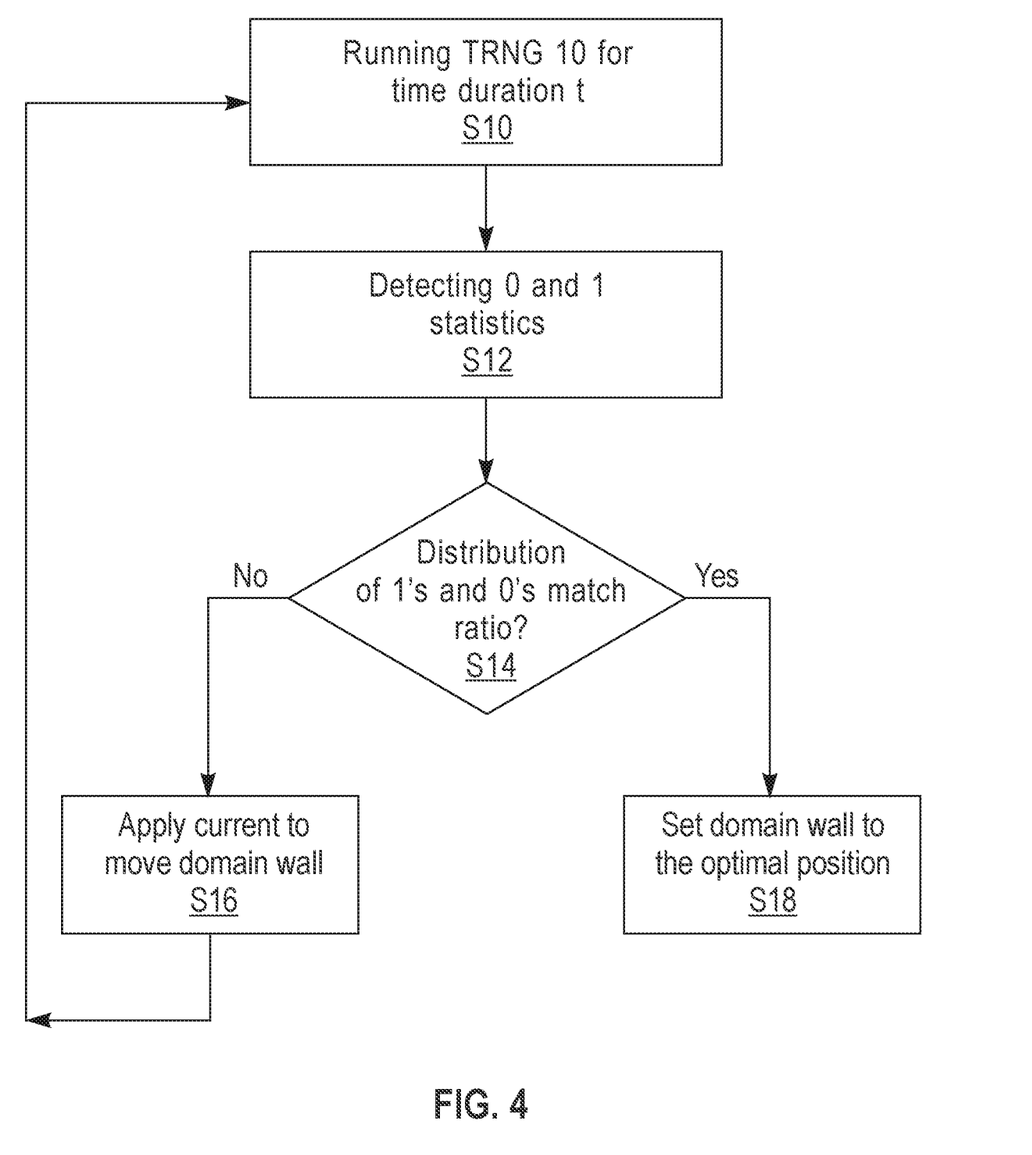
FIG. 4 is a flow diagram of one embodiment of the method tuning the TRNG disclosed in this specification.

In one embodiment, as shown in FIG. 4, a method of tuning the TRNG 10 includes, step S10 of running the TRNG 10 for time duration t, step S12 of detecting 0 and 1 statistics and step S14 of determining if the distribution of 1's and 0's is matching an intended ratio. In one embodiment, step S12 is performed by counter 40, counter 42 and comparator 44 and the step S14 is performed by verification circuit 46. The method includes in step S16, if the distribution of 1's and 0's does not match the intended ratio, NO in step S14, moving the domain wall 22 with current applied to terminals 26 and 28. Steps S10-S16 are repeated until the distribution of 1's and 0's matches the intended ratio. The matching may be within an acceptable margin of error. In step S18, the method sets the domain wall 22 to the optimal position when the distribution of 1's and 0's matches the intended ratio, YES in step S3.

As described above, readout circuitry 32 senses the flips in the orientation of the magnetization in the magnetic free layer 16. The readout circuitry 32 converts the random flip in the orientation of the magnetic free layer 16 to a random number sequence. In one embodiment, the readout circuit may include a time-to-amplitude converter and a pulse height discriminator. The random flipping of the magnetization in the free layer 16 causes pulses of current to flow through the readout circuit 32. The pulse height discriminator and the time-to-amplitude converter convert these pulses, via digital circuitry, into a random number which can be in the form of a series of 1's and 0's. In one embodiment, the readout circuit includes a comparator that uses logic devices and gates.

In one embodiment, a low Eb can be used to create a system that can flip between two states in a random fashion in the order of nanoseconds. The flipping of the magnetization in the free layer 16 causes the current going through the system to change randomly. The time the free layer 16 spends in parallel orientation is random. The digital circuitry of readout circuitry 32 converts these random pulse arrivals into voltage pulses that can be converted into a bit stream.

The fluctuation of the MTJ's free layer can be converted into electrical signals (such as electrical currents) via the tunnel magnetoresistance effect described earlier. Once the fluctuations is converted into a current or voltage signal, they can be compared, thresholded, and converted into stochastic digital bit streams (the so-called Bernoulli sequences) fully compatible with CMOS digital circuit applications while preserving the statistical nature of the fluctuating MTJ's.

The resistance, and thus the bit state, of MTJ structure 12 is determined by the relative orientation of the magnetization orientations of layer FL 16 and RF layer 18. MTJ structure 12 is in the low resistance state when the magnetization orientations of FL layer 16 and RF 18 can be parallel relative to each other and in the high resistance state when the magnetization orientations of FL layer 16 and RF layer 18 can be anti-parallel relative to each other. The low resistance state can represent a 0 bit and the high resistance state can represent a 1 bit, or vice versa.

In one aspect, the energy barrier can be chosen according to the desired speed at which the TRNG devoice 10 creates the random numbers and at which the random numbers can be read. For example, if a speed of creating a random bit e.g. every 100 ns is desired, the FL 16 should have a reasonable flipping probability within those 100 ns, in order for the number to be sufficiently random for the particular application. Since the retention time for which the bit is stable is ~exp [energy barrier (Eb)/kT], an Eb~20 kT, where k is the Boltzmann constant and T is the absolute temperature, can be selected for the barrier layer 20. Such an energy barrier is low with respect to a non-volatile MRAM bit where the target would be more like Eb~60 kT. In one embodiment, a thin layer with a low moment per area (Mst) and low anisotropy is one way of achieving low Eb such as <20 kT. The energy barrier controls both the fluctuation life-time and the statistical distribution (mean value) of the state. If the barrier is high compared to kT, the fluctuation over the barrier occurs infrequently, thus each state has a long life time. In simple anisotropy potentials, the life-time is proportional to exp [energy barrier (Eb)/kT]. By engineering the energy potential's landscape (its dependence on angular position of the moment), and by subjecting the free-layer under different bias-conditions—in the form of external magnetic field, or a spin-current through the MTJ, the life-time and the statistical mean of the fluctuation can be controlled.

In contrast to most CMOS circuits used to generate random numbers, the TRNG device requires no static power to maintain its stochastic state, since it is maintained by environmental thermal agitation. The power consumption of utilizing this type of device comes mainly from the read-out operation, and the operation of changing the domain-wall element's memory position (which requires active current write). Once a new state is written into the device, it is maintained, and the new stochastic fluctuation pattern should persist without further input power. Further, the device itself requires a relatively small foot-print. The MTJ itself has its lateral size on the order of 10-50 nm, and the domain wall structure can be designed into size ranges comparable to that of the MTJ as well. Thus even including the read-out and drive circuit, this class of TRNG is compact in size compared to traditional circuit implementations.

In one aspect, the TRNG of this disclosure operates at low voltages to generate random numbers with very little power consumption. In one embodiment, the TRNG of this disclosure includes an MTJ with a low Eb and a low Mst. Eb is the energy barrier between the parallel and anti-parallel states of the free layer and the reference layer of the MTJ. Mst is the square of the specific moment per surface area of the free layer. In one embodiment, the TRNG of this disclosure has a compact implementation on silicon and can be easily scaled.

In one aspect, the MTJ structure 12 is formed by first depositing blanket layers of the various MTJ structure materials and thereafter patterning the depositing blanket layers of the various MTJ structure materials by etching. The various MTJ structure materials can be formed by utilizing one or more deposition processes such as, for example, plating, sputtering, plasma enhanced atomic layer deposition (PEALD), plasma enhanced chemical vapor deposition (PECVD) or physical vapor deposition (PVD).

The magnetic reference material 18 has a fixed magnetization. The magnetic reference material 18 may be composed of a metal or metal alloy (or a stack thereof) that includes one or more metals exhibiting high spin polarization. In alternative embodiments, exemplary metals for the formation of the magnetic reference material 18 include iron, nickel, cobalt, chromium, boron, or manganese. Exemplary metal alloys may include the metals exemplified by the above. In another embodiment, the magnetic reference material 18 may be a multilayer arrangement having (1) a high spin polarization region formed from of a metal and/or metal alloy using the metals mentioned above, and (2) a region constructed of a material or materials that exhibit strong perpendicular magnetic anisotropy (strong PMA). Exemplary materials with strong PMA that may be used include a metal such as cobalt, nickel, platinum, palladium, iridium, or ruthenium, and may be arranged as alternating layers. The strong PMA region may also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys may be arranged as alternating layers. In one embodiment, combinations of these materials and regions may also be employed.

In one aspect, the tunnel barrier material 20 is composed of an insulator material and is formed at such a thickness as to provide an appropriate tunneling resistance. Exemplary materials for the tunnel barrier material 20 include magnesium oxide, aluminum oxide, and titanium oxide, or materials of higher electrical tunnel conductance, such as semiconductors or low-bandgap insulators.

The tunnel barrier layer 20 is sufficiently thin that quantum-mechanical tunneling of the charge carriers occurs between the ferromagnetic layers 16 and 18. The tunneling process is electron spin dependent, which means that the tunneling current across the junction depends on the spin-dependent electronic properties of the ferromagnetic materials and is a function of the relative orientation of the magnetic moments (magnetization directions) of the two ferromagnetic layers 16 and 18. The two ferromagnetic layers 16 and 18 can be designed to have different responses to magnetic fields so that the relative orientation of their moments can be varied with an external magnetic field or by the tunneling current itself.

In one aspect, the magnetic free material 16 may be composed of a magnetic material (or a stack of magnetic materials) with a magnetization that can be changed in orientation relative to the magnetization orientation of the magnetic reference material 18. Exemplary magnetic materials for the magnetic free layer 24 include alloys and/or multilayers of cobalt, iron, alloys of cobalt-iron, nickel, alloys of nickel-iron, and alloys of cobalt-iron-boron.

In one embodiment, the device 10 may include a magnetic separation layer (MSL) 24 between the magnetic free layer 16 and the domain wall wire 14. The MSL 24 gives more freedom as compared to a tunnel barrier or DC resistance-based readout. MSL 24 also helps against large voltage drop which otherwise would appear over a thin dielectric as a domain wall requires large current density, $\sim 10^7$ A/cm$^2$, for example. The MSL layer 24 may be composed of NiO material for example.

The MSL layer 24 functions to electrically connect the MTJ 12 to domain wall wire 14, while at the same time allowing controlled magnetic coupling between the domain wall wire 14 and the MTJ 12. The coupling in one embodiment is achieved by the dipolar field, i.e. the fringe magnetic field generated by the domain wall's inhomogeneous dipole moments. It is also possible to engineer the MSL layer 24 to have a controlled amount of magnetic exchange at its interfaces with both the domain wall wire layer 14, and the free layer 16 of MTJ 12. In such a situation the magnetic coupling can also be achieved by the exchange coupling directly to let the free layer 16 of the MTJ 112 see what direction the domain wall magnetic moment is pointing through the exchange coupling.

The function of the MSL 24 is also to isolate the MTJ 12 from the charge-current related electrical potential drop across the domain wall wire when charge current is passed through the domain wall wire to drive the domain wall motion. The MSL layer 24 can be reasonably thick so as not be susceptible to voltage-induced breakdown The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

In addition, while preferred embodiments of the present invention have been described using specific terms, such description is for illustrative purposes only, and it is to be understood that changes and variations may be made without departing from the spirit or scope of the following claims.

What is claimed is:

1. A true random number generator (TRNG) apparatus comprising:
    magnetic tunnel junction (MTJ) structure including:
        a magnetic reference layer;
        a magnetic free layer; and
        a tunnel barrier layer sandwiched between the reference layer and the free layer; wherein the free layer has anisotropy energy sufficiently low to provide stochastic fluctuation in the orientation of the magnetic state of the free layer via thermal energy; and
        a magnetic dipole layer coupled to the free layer of the MTJ structure, the magnetic dipole layer having a domain wall separating magnetic domains that are in opposite directions, wherein the magnetic dipole layer is sufficiently coupled to the free layer of the MJT structure such that application of a current through the magnetic dipole layer causes movement of the location of the domain wall and wherein control of the current tunes a probability distribution of the fluctuation in the orientation of the magnetic state of the free layer.

2. The TRNG apparatus of claim 1, wherein the magnetic dipole layer includes two terminals configured for applying the current flowing through the domain wall wire sufficient to move the domain wall.

3. The TRNG apparatus of claim 2, further including a current source coupled to the two terminals of the magnetic dipole layer for switching a direction of the current flowing through the magnetic dipole layer to move the domain wall in a direction opposite of the direction of the current.

4. The TRNG apparatus of claim 3, further including a tuning circuit coupled to the current source for tuning the probability distribution of the magnetic states.

5. The TRNG apparatus of claim 1, further including a readout circuitry that detects of the relative magnetic orientation of the free layer and converts the fluctuation in the orientation of the magnetic state of the free layer into a random number sequence of 1's and 0's.

6. The TRNG apparatus of claim 4, wherein the tuning circuit comprises a first counter counting 1's and a second counter counting 0's, and a comparator that compares the outputs of the first and second counters, wherein the output of comparator drives the current source to change direction of current depending on comparator output.

7. The TRNG apparatus of claim 4, wherein the tuning circuit includes a verification circuit for determining whether a uniformity of the distribution of the fluctuation in the orientation of the magnetic state of the free layer is below a threshold.

8. The TRNG apparatus of claim 7, wherein the verification circuit controls the current source for applying a current in response to the uniformity of the distribution of the fluctuation in the orientation of the magnetic state of the free layer being below the threshold, the current being applied to adjust the position of the domain wall such that that uniformity of the distribution is at or above the threshold as determined by the verification circuit.

9. The TRNG apparatus of claim 1, further including a magnetic separation layer coupled between the magnetic free layer and the magnetic dipole layer.

10. The TRNG apparatus of claim 9, wherein the magnetic separation layer comprises NiO.

11. The TRNG apparatus of claim 8, wherein the verification circuit detects a ratio of 1's and 0's and determiners whether the ratio is below a threshold.

12. A method of forming a true random number generator (TRNG) apparatus comprising:
    forming a magnetic tunnel junction (MTJ) structure including:
        forming a magnetic reference layer;
        forming a magnetic free layer; and
        forming a tunnel barrier layer sandwiched between the reference layer and the free layer; wherein the free layer has anisotropy energy sufficiently low to provide stochastic fluctuation in the orientation of the magnetic state of the free layer via thermal energy;
    forming a magnetic dipole layer coupled to the free layer of the MTJ structure, the magnetic dipole layer having a domain wall separating magnetic domains that are in opposite directions, wherein the magnetic dipole layer is sufficiently coupled to the free layer of the MJT structure such that application of a current through the magnetic dipole layer causes movement of the location of the domain wall; and controlling the current for adjusting the location of the domain wall to tune a probability distribution of the fluctuation in the orientation of the magnetic state of the free layer.

13. The method of forming a TRNG apparatus of claim 12, further including tuning the TRNG by switching a direction of the current flowing through the magnetic dipole layer to move the domain wall in a direction opposite of the direction of the current.

14. The method of forming a TRNG apparatus of claim 12, further including forming a readout circuitry for detecting of the relative magnetic orientation of the free layer and converting the fluctuation in the orientation of the magnetic state of the free layer into a random output of a random number sequence of 1's and 0's.

15. The method of forming a TRNG apparatus of claim 13, further including tuning a probability distribution of the random output, by comparing outputs of a first counter counting 1's and a second counter counting 0's and changing direction of the current applied to the domain wall depending on comparator output.

16. The method of forming a TRNG apparatus of claim 15, further including determining whether a uniformity of the distribution of the random output is below a threshold.

17. The method of forming a TRNG apparatus of claim 16, further including applying a current in response to the uniformity of the distribution of the random output being below the threshold, the current being applied to adjust the position of the domain wall such that that uniformity of the distribution of the random output is at or above the threshold.

18. The method of forming a TRNG apparatus of claim 13, further including running the TRNG apparatus for time duration t, detecting 0 and 1 statistics of the random output, determining if the distribution of 1's and 0's is matching an intended ratio, and in response to the distribution of 1's and 0's not matching the intended ratio, moving the domain wall with the current applied to the magnetic dipole layer.

19. The method of forming a TRNG apparatus of claim 18, further comprising repeatedly adjusting the current applied to the magnetic dipole layer to move the domain wall and setting the domain wall at a position in which the distribution of 1's and 0's matches the intended ratio.

20. The method of forming a TRNG apparatus of claim 12, further including forming a magnetic separation layer coupled between the magnetic free layer and the magnetic dipole layer.

* * * * *